United States Patent [19]
Berkcan et al.

[11] Patent Number: 5,952,819
[45] Date of Patent: Sep. 14, 1999

[54] AUTO-ZEROING CURRENT SENSING ELEMENT

[75] Inventors: Ertugrul Berkcan; Jerome Johnson Tiemann, both of Schenectady, N.Y.

[73] Assignee: General Electric Company, Schenectady, N.Y.

[21] Appl. No.: 08/899,766

[22] Filed: Jul. 24, 1997

[51] Int. Cl.$^6$ .............................. G01R 19/00; G01R 33/00
[52] U.S. Cl. ......................... 324/117 R; 324/96; 324/127
[58] Field of Search ............................... 324/117 R, 126, 324/127, 244, 244.1, 96, 260

[56] References Cited

U.S. PATENT DOCUMENTS

| | | | |
|---|---|---|---|
| 5,146,156 | 9/1992 | Marcel | 324/117 R X |
| 5,296,802 | 3/1994 | Beranger et al. | 324/117 R |
| 5,485,079 | 1/1996 | Itoh | 324/117 R X |
| 5,734,264 | 3/1998 | Berna et al. | 324/127 X |

Primary Examiner—Gerard Strecker
Assistant Examiner—T. R. Sundaram
Attorney, Agent, or Firm—Marvin Synder; Douglas E. Stoner

[57] ABSTRACT

A current sensor for sensing alternating current in a current-carrying conductor includes a substantially C-shaped magnetic core having first and second ends with a gap therebetween. A current sensing element, which includes a microresonant element, is positioned proximate the gap between the first and second ends of the magnetic core such that the element oscillates when exposed to an alternating magnetic field. A biasing coil is attached to the microresonant element for carrying a bias current. The microresonant element resonates, or vibrates, at a standard oscillating frequency when no current is present in the biasing coil, and resonates at a modified oscillating frequency when current is present in both the biasing coil and the current-carrying conductor. The magnitude of current in the current-carrying conductor is determined as a multiple of the product of a ratio of the standard oscillating frequency and the modified oscillating frequency, and the bias current.

18 Claims, 4 Drawing Sheets

AUTO-ZEROING CURRENT SENSING ELEMENT

FIELD OF THE INVENTION

This invention relates generally to sensing current in conductors and, more particularly, to sensing elements for use in current sensors.

BACKGROUND OF THE INVENTION

Many electrical and electronic devices include current sensors for sensing current in a conductor. For example, in at least one known electricity meter, a current sensor is provided to sense current in a line conductor carrying an input current $I_{in}$. A current divider divides input current $I_{in}$ into two currents $I_1$ and $I_2$, which are carried through respective resistors $R_1$ and $R_2$. A current comparator senses input current $I_2$ and provides a scaled output current $I_{out}$ proportional to input current $I_{in}$ but many magnitudes lower than that of input current $I_{in}$.

A known current comparator includes a current transformer having a core of magnetic material, a single turn primary winding, and first and second secondary windings which are sometimes referred to as sensing and feedback windings. Each winding has a large number of turns of fine gage wire evenly distributed around the core. The core encircles resistor $R_2$ carrying current $I_2$. In operation, an alternating magnetic flux from resistor $R_2$ and produced by current $I_2$ is induced in the current comparator transformer core. A voltage therefore is induced in the first secondary, or sensing, winding of the transformer. The signal from the sensing winding is provided to a high gain differential amplifier, and the amplifier output voltage is supplied to the feedback winding. The current in the feedback winding is the scaled output current $I_{out}$. The feedback winding is configured to induce a compensating flux in the core, which reduces the alternating flux in the core toward zero. The current transformer and amplifier operate dynamically to keep the alternating magnetic flux in the core at a very low value approaching zero. As a result, the magnetizing ampere turns resulting from the measured or sensed current $I_2$ in the single turn primary winding (formed by resistor $R_2$) are balanced by the magnetizing ampere turns resulting from current $I_{out}$ in the feedback winding. This type of current sensor is sometimes referred to as an auto-zeroing toroidal current sensor. Particularly, the current comparator core is toroidally shaped, the secondary windings are toroidal windings, and the alternating magnetic flux in the core is maintained at a value approaching zero. Although this known sensor provides acceptable results, it is relatively complex and expensive.

SUMMARY OF THE INVENTION

In accordance with the invention, a current sensor is provided which, in one embodiment, includes a C-shaped magnetic core and a current sensing element. A current-carrying conductor, e.g., a conductor bar, extends through the core substantially coaxially with the core center axis. The ends of the core are separated by a gap.

The current sensing element includes a biasing coil conductor formed on a circuit board adhesively secured to one leg of the C-core so that it extends between the respective C-core ends. The sensing element is positioned relative to the gap so the magnetic field generated by the current-carrying conductor is amplified and oriented to affect the sensing element as described below.

In one form, the sensing element further includes a microresonant element that has a normal mode of vibration, and a biasing current source for transmitting a bias current through the biasing coil conductor. A control processor is coupled to control the bias current source and is coupled to the microresonant element, e.g., by capacitive coupling. The control processor controls the state of the bias current source and receives signals representative of the resonant frequency of the microresonant element.

When there is no bias current in the biasing coil conductor, current in the current-carrying conductor causes the microresonant element to oscillate at a standard oscillating frequency $f_o$. Bias current in the biasing coil conductor produces a biasing magnetic field which interacts with the current-carrying conductor magnetic field to generate a force that acts on the microresonant element. As a result, the oscillation frequency of the element changes from a frequency $f_0$ to a frequency f.

The control processor, by controlling the state of the bias current source, determines frequencies f and $f_0$. The magnitude of current in the current-carrying conductor is then determined by the control processor using the ratio of these frequencies, i.e., $f/f_0$. Specifically, the ratio of current in the current-carrying conductor and bias current in the biasing coil conductor is directly proportional to the normalized frequency ratio $f/f_0$ Since the magnitude of the biasing current is known, the magnitude of the current in the current-carrying conductor can be determined.

The current sensor of the invention is auto-zeroing in that by utilizing the frequency ratio $f/f_0$, the effects of external conditions such as temperature automatically are substantially eliminated. Specifically, external conditions such as temperature have the same effect on the sensor when the microresonant element vibrates at frequency f as when such element vibrates at frequency $f_0$. The normalized frequency ratio therefore substantially cancels out such effects, i.e., the effects have approximately a one-to-one ratio, which facilitates accurate current sensing.

The range of the above described current sensor is controlled by controlling the bias current magnitude. For example, if a low magnitude current is to be sensed, the selected bias current magnitude should be high. Increasing the bias current magnitude results in increasing the sensitivity, or range, of the current sensor. Therefore, the control processor, by simply controlling the bias current magnitude, controls the range of the sensor. Such construction facilitates auto-ranging, i.e., automatically adjusting the current sensor range based on the sensed current magnitude, since the bias current magnitude can easily be adjusted in response to the sensed current magnitude.

The current sensor of the invention is also highly specific in terms of providing an accurate measure of the current magnitude to be sensed. Particularly, by using the ratio $f/f_0$, the effects of external magnetic fields are substantially cancelled out since they affect both frequencies f and $f_0$ substantially about the same, as described above. Therefore, the effects of magnetic fields associated with currents other than those in the current-carrying conductor are substantially eliminated.

The current sensor of the invention requires no current shunt arrangement and utilizes no toroidal windings, and hence is believed to be easier to manufacture than known current sensors.

DETAILED DESCRIPTION OF THE DRAWINGS

Figure 1:
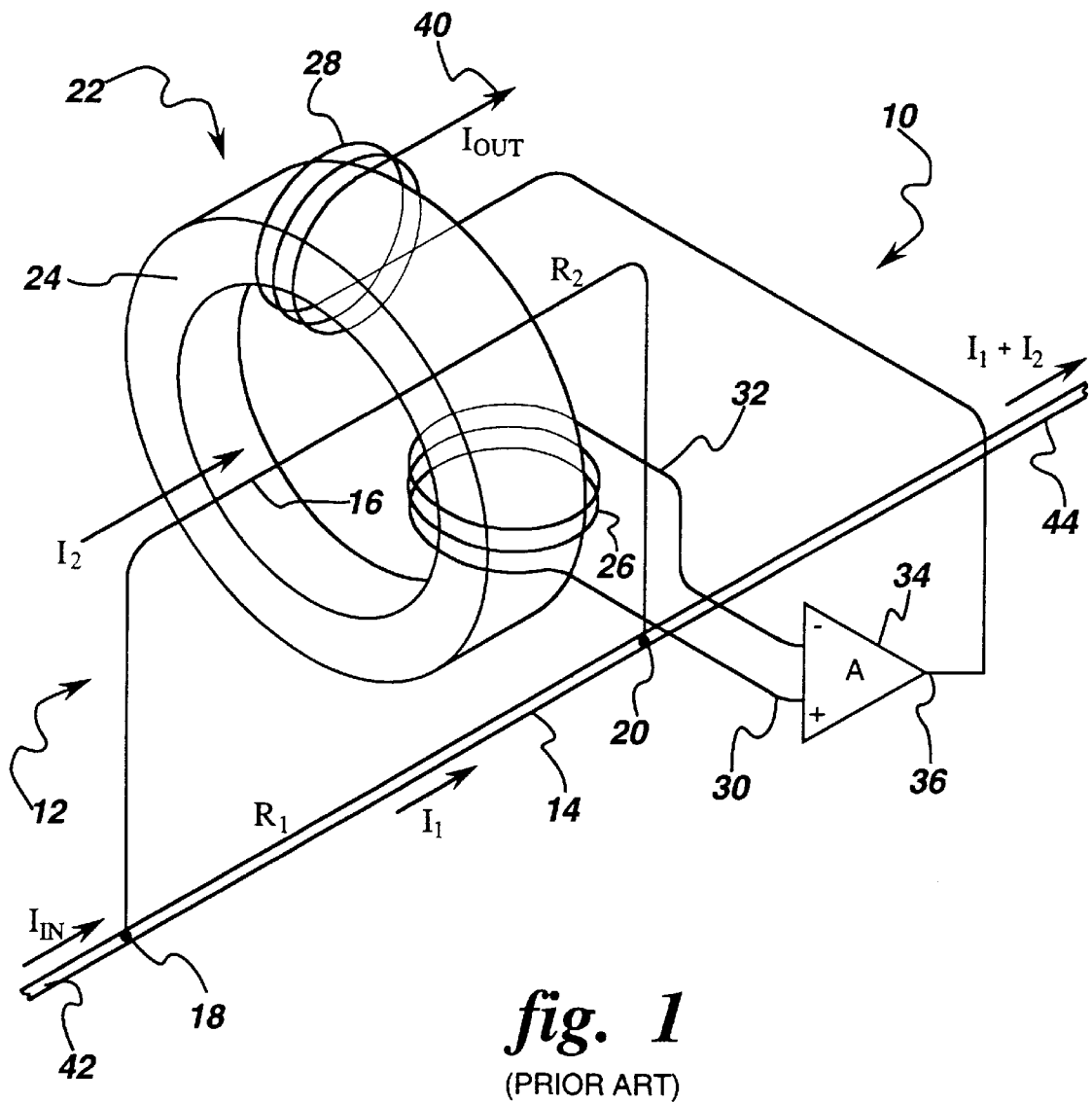
FIG. 1 is a simplified electrical schematic diagram of a known current sensor.

FIG. 1 illustrates a known current sensor 10 which includes a current divider, shown generally at 12. Divider 12 includes a first current-carrying element 14, shown as a shunt resistor having an ohmic value $R_1$, and a second current-carrying element 16, shown as a measuring resistor having an ohmic value $R_2$. Resistors 14 and 16 are connected in parallel at nodes 18 and 20.

Sensor 10 also includes a current comparator 22, shown as a toroidal current transformer, which includes a core 24 of magnetic material and first and second windings 26 and 28, respectively. Windings 26 and 28 each consist of a large number N of turns of fine gage wire evenly distributed around core 24. Core 24 encircles resistor 16, and resistor 16 serves as a single turn primary winding for current comparator 22.

An alternating current line to be measured divides into a current $I_1$ in shunt resistor 14 and a current $I_2$ in measuring resistor 16. This provides a first stage of scaling of input current $I_{in}$, and current $I_2$ is given by:

$$I_2 = \frac{I_{in}}{K}, \quad (1)$$

where $$K = \frac{R_2}{R_1} + 1.$$

Current comparator 22 provides a second stage of scaling of input current $I_{in}$ by sensing current $I_2$ in resistor 16 and providing a fully scaled output current or signal $I_{out}$ having a magnitude proportional to input current $I_{in}$, but many magnitudes lower than input current $I_{in}$. More particularly, in toroidal current transformer 22, an alternating magnetic flux from resistor 16 is induced in core 24. Secondary winding 26 on core 24 senses this alternating flux in core 24, resulting in an induced voltage in winding 26 that constitutes an input signal, via conductors 30 and 32, to negative (−) and positive (+) input terminals of a high gain differential amplifier 34.

An output terminal 36 of amplifier 34 is coupled to one end of compensation or feedback winding 28. The output signal from amplifier 34 provides an output current $I_{out}$ through winding 28 to an output terminal 40. The direction of current through winding 28 is such as to induce a compensating flux from winding 28 into core 24 to reduce the alternating flux in core 24 toward zero, i.e., sensor 10 is auto-zeroing. Toroidal current transformer 22 and amplifier 34 operate dynamically to keep the alternating magnetic flux in core 24 at a very low value approaching zero. As a result, the magnetizing ampere turns resulting from current $I_2$ in the single turn primary winding (formed by resistor 16 ) of core 24 are balanced by the magnetizing ampere turns resulting from current $I_{out}$ in the N-turn secondary winding 28. Since the transformer ampere turns are equal, or balanced, then:

$$N*I_{out}=I_2* 1, \text{ and } I_{out}=I_2/N \quad (2a)$$

Substituting from Equation (1) yields:

$$I_{out} = \frac{I_{in}}{K*N}.$$

Thus output current $I_{out}$ of current sensor 10 is a scaled version of input current $I_{in}$, where the final scaling factor is the product of two independent scale factors determined by a ratio of resistances (K) and the number of turns N in the output or secondary winding 28. Current sensor 10 is typically configured to receive input current $I_{in}$ from a line conductor 42, and total current $I_1+I_2$ passes from sensor 10 through a conductor 44 to a load, e.g., a residence or industrial site.

Although sensor 10 provides acceptable results, formation of windings 26 and 28 on core 24 requires specialized tooling, which is expensive. In addition, current divider (or shunt) 12 adds to the complexity of assembling sensor 10. It would be desirable to eliminate windings 26 and 28, as well as current divider 12.

Figure 2:
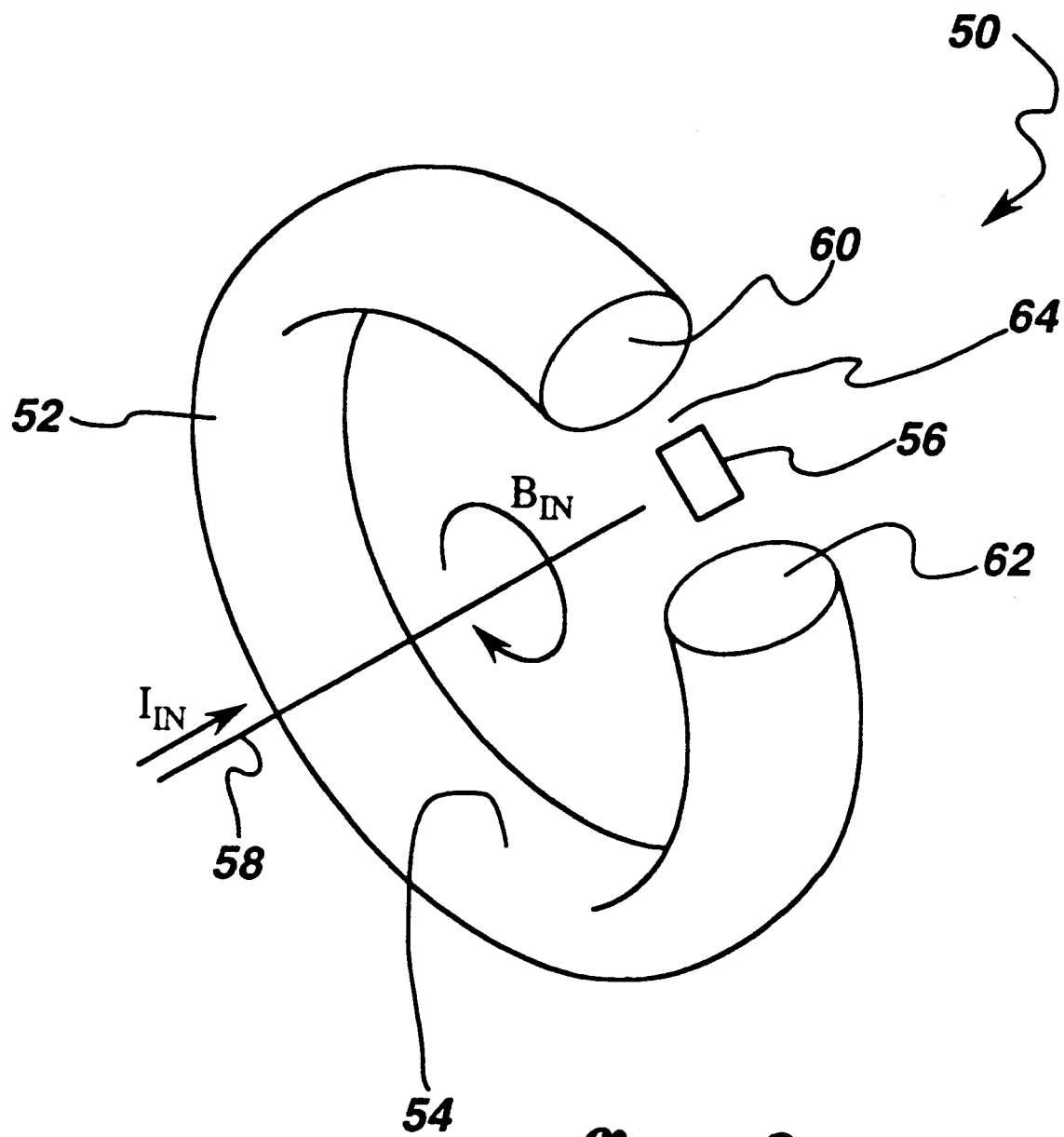
FIG. 2 is a simplified schematic diagram of a current sensor in accordance with one embodiment of the present invention.

FIG. 2 is a simplified showing of a current sensor 50 in accordance with one embodiment of the invention. Sensor 50 has no windings and no current divider, as required in sensor 10, and thus is believed to provide important advantages such as ease of manufacture and relatively low cost. In addition, sensor 50 is auto-zeroing and auto-ranging, which facilitate highly accurate current sensing.

Current sensor 50 includes a substantially C-shaped magnetic core 52 having a conductor opening 54 and a current sensing element 56. A current-carrying conductor 58, e.g., a conductor bar, extends through conductor opening 54 so as to be substantially encircled by core 52. Core 52 further includes first and second ends 60 and 62, respectively, with a gap 64 therebetween. Current sensing element 56 is located proximate, i.e., next to or within, gap 64 so that the magnetic field generated by current-carrying carrying conductor 58 is amplified and directed toward sensing element 56 by magnetic core 52.

In one form, current sensing element 56 includes a microresonant element 66 (FIG. 3) which is formed of a material that resonates or vibrates when subjected to external forces such as magnetic fields. For example, in one embodiment, microresonant element 66 is a crystal that, when excited by a magnetic field, vibrates or oscillates at a normal mode of vibration. Such crystals are well known in the art.

Current sensing element 56 is positioned relative to gap 64 so that the microresonant element oscillates when exposed to an alternating magnetic field. An oscillation sensor (not shown) is capacitively coupled to the microresonant element, and generates signals representative of the oscillation frequency of the microresonant element. Sensing element 56 may be secured to a printed circuit board (not shown) and supported thereby in gap 64. For example, the circuit board may be adhesively secured, e.g., by an epoxy, to one arm of C-core 52 so that the board extends over gap 64.

Figure 3:
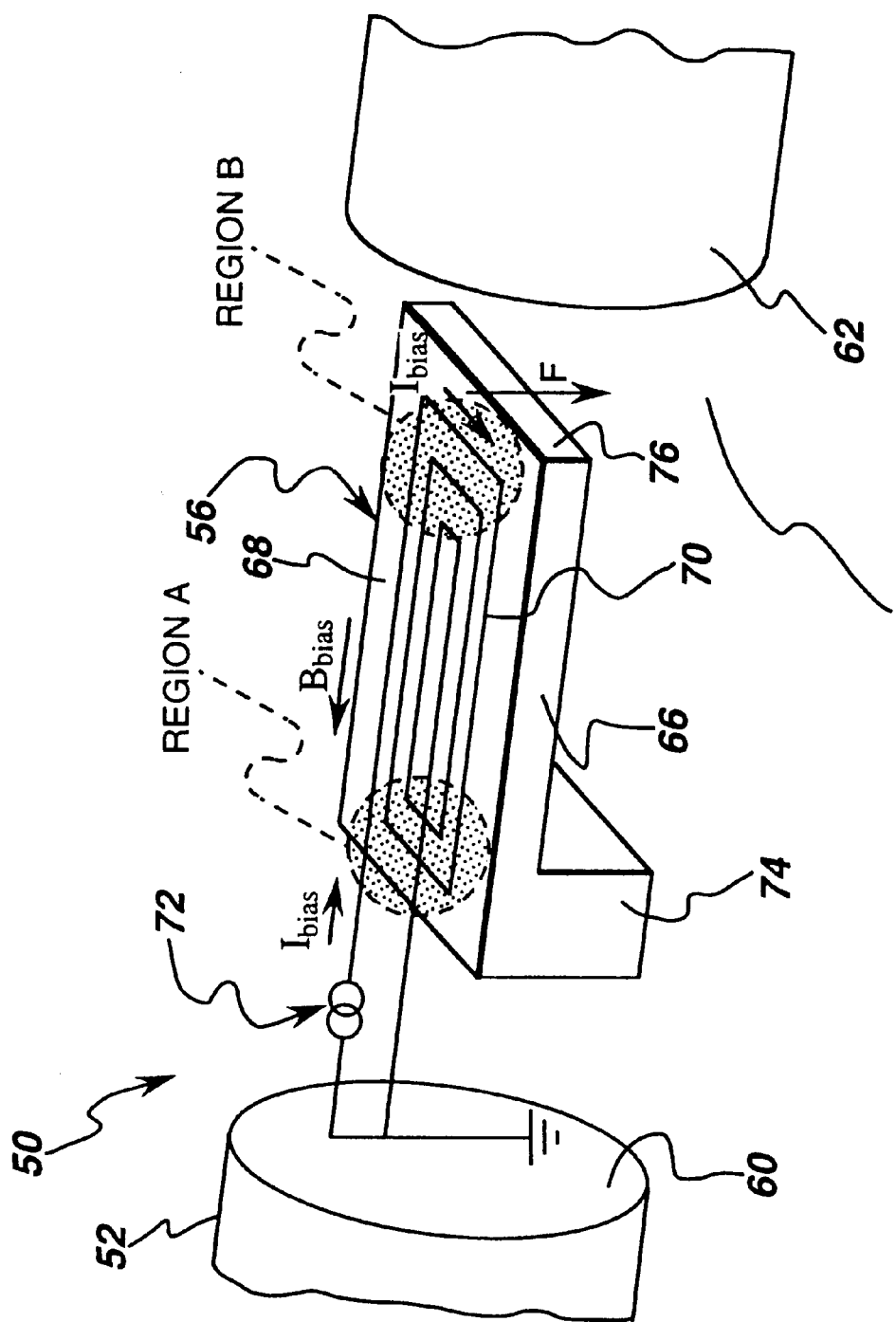
FIG. 3 is an exploded partial perspective view of the current sensor shown in FIG. 2.

In an exemplary embodiment, microresonant element 66, shown in FIG. 3, may be either a micro-cantilever or a micro-bridge bridge packaged in a conventional integrated circuit package, as is well known. Microresonant element 66 includes a bias surface 68 having a biasing coil 70 secured thereto. Biasing coil 70 may be formed directly on surface 68, for example, using known vapor deposition and photolithographic techniques, and selectively carries a bias current $I_{bias}$ provided by a bias alternating current source 72. When bias current $I_{bias}$ is present in coil 70, an alternating bias magnetic flux $B_{bias}$ is generated.

Microresonant element 66 further includes first and second portions 74 and 76, respectively. As shown, biasing coil 70 extends through a Region A in first portion 74 and through a Region B in second portion 76. Regions A and B are generally indicated by shading. First portion 74 is more than second portion 76 due to different material thicknesses at Regions A and B. This results in a larger displacement due to the forces resulting from alternating magnetic fluxes at regions A and B. The net motion of microresonant element 66 is therefore non-zero because of the different compliances.

In one embodiment, a control processor (not shown) is coupled to, and controls operation of, current source 72. In addition, the processor is coupled to element 66 e.g., by capacitive coupling, so as to receive signals representative of the frequency of microresonant element 66. Capacitive coupling techniques are well known.

Conductor 58 (FIG. 2) carries an input current $I_{in}$ to be measured by current sensor 50. The input current generates a magnetic flux $B_{in}$ which is oriented and magnified by magnetic core 52. Generally, input current $I_{in}$ is measured by determining the effects, on sensor 50, of electromagnetic force F between the magnetic fields of conductor 58 and biasing coil 70. That is, input current $I_{in}$ is measured by determining sensing element 56 displacement between an initial state, when there is no bias current in biasing coil 70, and a modified state when there is bias current in biasing coil 70.

More particularly, the oscillating frequencies of microresonant element 66 are determined when there is and when there isn't bias current in biasing coil 70. When there is no bias current in coil 70 and when input current $I_{in}$ is present in conductor 58, i.e., current sensing element 56 is in an "initial state", microresonant element 66 oscillates at a standard oscillating frequency $f_0$. With a bias current in coil 70, i.e., current sensing element 56 is in a "modified state", alternating bias magnetic field $B_{bias}$ interacts with the magnetic field of current-carrying conductor 58 to generate a force which alters the oscillating frequency of microresonant element 66 to a modified oscillating frequency f. By controlling the state of bias current source 72, the control processor determines standard oscillating frequency and modified oscillating frequency f The processor uses these determined frequencies to generate a normalized frequency, which in turn can be used to determine input current $I_{in}$. The normalized frequency is obtained by dividing modified oscillating frequency f by standard oscillating frequency $f_0$, i.e., $f/f_0$. In the exemplary embodiment, the ratio of current $I_{in}$ and bias current $I_{bias}$ is directly proportional to the frequency ratio $f/f_0$. Since the magnitude of biasing current $I_{bias}$ is known, the magnitude of current $I_{in}$ can be determined.

By using the normalized frequency, sensor 50 is auto-zeroing zeroing. More specifically, and when $I_{bias}=0$, standard oscillation frequency $f_0$ is independent of the force resulting from interaction of magnetic fields associated with currents $I_{bias}$ and $I_{in}$. Standard oscillation frequency $f_0$ is, however, dependent on ambient temperature and other environmental factors. Modified oscillating frequency f is also dependent upon such environmental factors. By using the normalized frequency ratio $f/f_0$, such effects substantially cancel out, i.e., such effects have about a one-to-one ratio, which provides auto-zeroing, or auto-normalization.

In an alternative embodiment, a radio frequency (RF) source can be used to produce oscillation of microresonant element 66 during operation of sensor 50, to facilitate obtaining frequency measurements. Since RF signals are substantially independent of temperature and other possible external conditions, use of an RF source should not introduce inaccuracies in the current sensor measurement. RF signal generators are well known in the art.

In another embodiment, the electromagnetic force between conductor 58 and coil 70 can be determined by shifting oscillating amplitudes of microresonant element 66 while driving current sensing element 56 at resonance. Absent any bias current and with input current $I_{in}$ in conductor 58, microresonant element 66 oscillates at an amplitude $A_0$. Presence of bias current $I_{bias}$ results in presence of alternating bias magnetic field $B_{bias}$ which shifts the oscillating amplitude from $A_0$ to a modified oscillating amplitude A.

A ratio of amplitudes A and $A_0$ may be used in the same manner as the normalized frequency ratio to obtain an accurate measure of input current $I_{in}$. Amplitudes A and $A_0$ also provide auto-zeroing zeroing. Both the standard oscillating amplitude $A_0$ and the modified oscillating amplitude A are substantially similarly affected by ambient temperature and other environmental factors. Using the ratio $A/A_0$ therefore substantially cancels the effects of such environmental factors and provides a normalized, auto-zeroed, current measurement.

Figure 4:
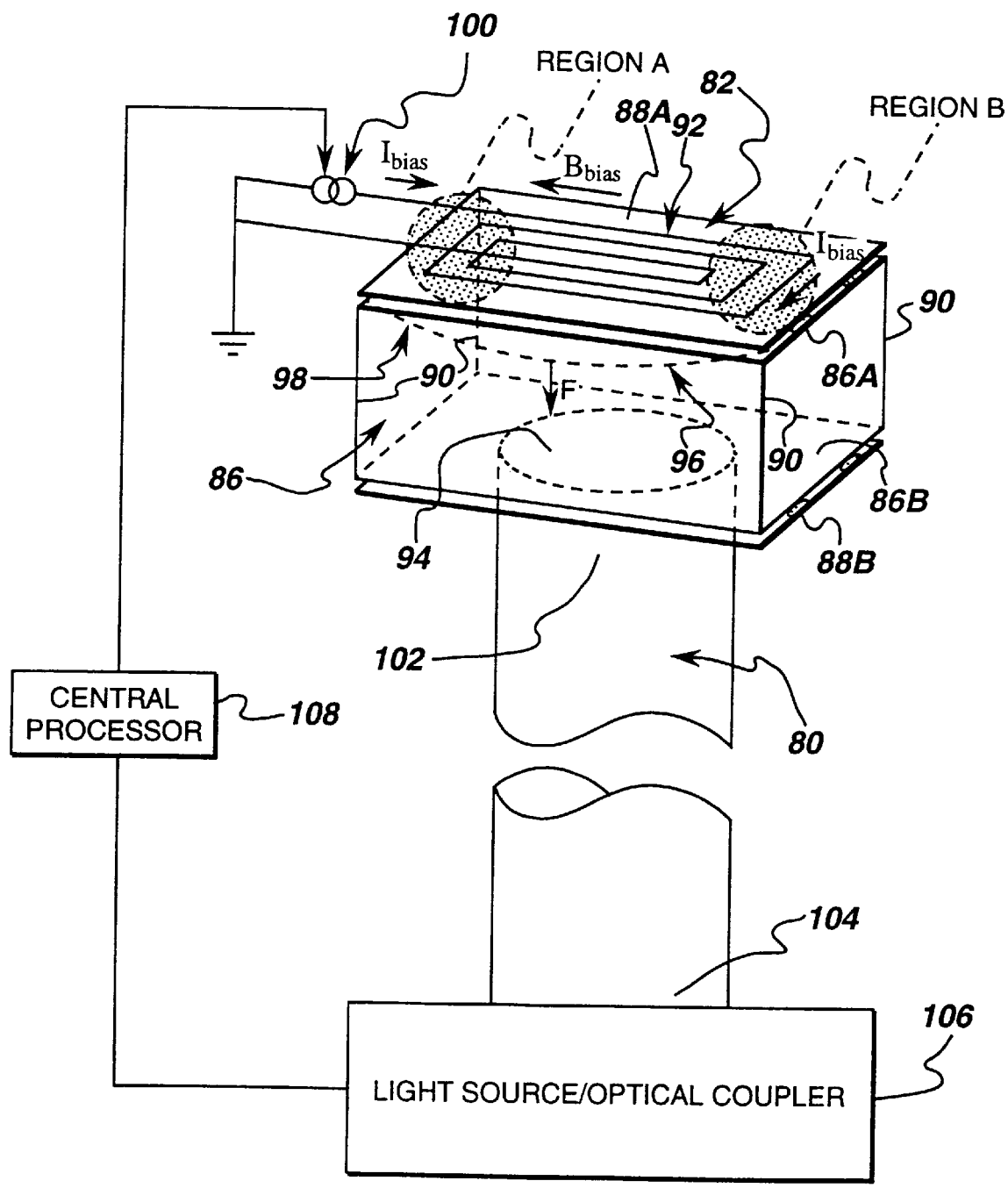
FIG. 4 is a partial perspective view of a fiber optic cable and a current sensing element in accordance with another embodiment of the present invention.

FIG. 4 illustrates a fiber optic cable 80 and a current sensing element 82 employed in accordance with another embodiment of the invention. As with sensor 50, sensing element 82 is positioned proximate to gap 64 (not shown in FIG. 4) so that the magnetic field generated by current-carrying conductor 58 is amplified and directed toward sensing element 82 by magnetic core 52 (FIG. 2). Sensing element 82 includes a substantially rectangular, thin pressure membrane, or diaphragm, 88A separated from a substantially rectangular, thin plate or member 88B by spacers 90. Members 88A and 88B include optically reflective surfaces 86A and 86B, respectively, and are positioned so that surfaces 86A and 86B face each other. Spacers 90 are formed of non-reflective material.

Sensing element 82 further includes a biasing coil 92 which is secured opposite reflective surface 86A to first member 88A of membrane 84. Second reflective surface 86B includes an optically transparent portion 94 and is secured at transparent portion 94 to an optic cable or fiber 80. Member 88A, which may be comprised of material such as amorphous silicon, includes a first portion 96 which is more compliant than a second portion 98. Specifically, first portion 96 moves, or displaces, more than second portion 98 when member 88A is exposed to external forces. The compliance of member 88A is selected by selecting the thickness of the membrane material. Specifically, member 88A is thicker at first portion 96 than at second portion 98. Member 88B is substantially rigid and may be comprised of semitransparent material such as inconel.

Biasing coil 92 is photolithographically formed on first member 88A and extends through a region A in first portion 96 and a region B in second portion 98. Biasing coil 92 carries a bias current, $I_{bias}$, generated by a bias current source 100. As with sensing element 56 (FIG. 3), a printed circuit board (not shown) may be used, for example, to support sensing element 82.

Optic fiber 80 is secured at a first end 102 to transparent portion 94 of member 88B of microresonant element 84, and is coupled at a second end 104 to a light source and a optical coupler 106. Such light sources and couplers are well known in the art. The light source transmits light signals through optic fiber 80 and through non-reflective portion 94 of member 88B into sensing element 82. The transmitted light signals are reflected by respective reflective surfaces 86A and 86B of membrane 88A and member 88B, respectively, and a portion of the reflected light returns through transparent portion 94 to optic fiber 80. The optical coupler separates the returning light signals from the transmitted light signals so that the returning signals may be processed. In one form, the frequencies of the returning light signals are spectrographically or radiometrically analyzed to determine the frequency of the returning light signals.

Operation of current source 100 may be controlled, in one embodiment, by a central processor 108. In addition, signals representative of the frequency of the returning light signals are supplied to the processor by, for example, capacitive coupling, which is well known.

The electromagnetic field F between biasing coil 92 and conductor 58 is determined by detecting motion, e.g., mechanical displacement, of member 88A. Particularly, in the presence of input current $I_{in}$ in conductor 58 and no current in biasing coil 92, sensing element 82 is in an initial state, i.e., member 88A is substantially parallel to member 88B. The light signal transmitted to sensing element 82 through fiber 80 reflects within the space between members 88A and 88B, and a portion of the reflected light returns through optic fiber 80. In the initial state, the light signal has a standard frequency $f_0$. When bias current $I_{bias}$ is present in biasing coil 92, sensing element 82 is in a modified state and a bias magnetic field Bbias is generated. Interaction between bias magnetic field Bbias and the magnetic field produced by current in conductor 58 results in upper member 88A being displaced, or bowed, as illustrated in phantom in FIG. 4. Due to such displacement, light reflected between members 88A and 88B is altered relative to such reflection in the initial state. The reflected light has a modified frequency when member 88A is displaced.

Standard frequency $f_0$ and modified frequency f are used to determine input current $I_{in}$. Once the standard frequency $f_0$ and oscillating frequency f are known, the central processor determines the normalized frequency, i.e., the ratio of modified oscillating frequency to standard oscillating frequency $f_0$, i.e., $f/f_0$. The normalized frequency is then used to determine input current $I_{in}$, as described above. Alternatively, a ratio of amplitudes A and $A_0$ may be used in the same manner as the normalized frequency ratio to obtain an accurate measure of input current $I_{in}$, as described for the embodiment shown in FIG. 3, for example.

The current sensors described above are auto-zeroing in that by utilizing the ratio $f/f_0$, the effects of external conditions such as temperature are eliminated since temperature changes, for example, have the same effect on frequency f as on frequency $f_0$. Such ratio therefore is substantially unaffected by temperature and other external conditions, which facilitates more accurate current sensing. Further, with respect to auto-ranging, the range of the above described current sensors is controlled by controlling the bias current magnitude. Auto-ranging, i.e., automatically selecting the current sensor range, is thus facilitated since the bias current magnitude is easily adjusted in response to the sensed current magnitude.

Such sensors are also highly specific in terms of providing an accurate measure of the sensed current magnitude since, by using the ratio $f/f_0$, the effects of external magnetic fields are substantially cancelled out by virtue of affecting both frequencies f and $f_0$ substantially about the same. Therefore, the magnetic fields associated with current other than current in conductor 58 (FIG. 2) are substantially eliminated.

The above described current sensors are less complex than known current sensors since, for example, they require no current shunt, and no toroidal windings. Such current sensors therefore should be easier to manufacture, and at reduced costs.

While only certain preferred features of the invention have been illustrated and described herein, many modifications and changes will occur to those skilled in the art. For example, while the magnetic core has been described as substantially C-shaped, it may have any of various other shapes. Moreover, while displacement of upper member 88A in FIG. 4 is described as being monitored by using a reflective light measurement, other structures for detecting displacement, or pressure changes, may alternatively be used. Accordingly, it is to be understood that the appended claims are intended to cover all such modifications and changes as fall within the true spirit of the invention.

What is claimed is:

1. A current sensor for generating a signal representative of alternating current in a current-carrying conductor, said current sensor comprising:

a magnetic core having first and second ends with a gap therebetween and shaped to form a conductor opening, said current-carrying conductor extending through said conductor opening; and a current sensing element including a biasing coil for carrying a bias alternating current, said sensing element being positioned relative to said gap between said first and second ends of said magnetic core so that said sensing element moves when exposed to alternating magnetic fields of the current-carrying conductor and the biasing coil.

2. A current sensor in accordance with claim 1 wherein said current sensing element further comprises a microresonant element, said biasing coil being affixed to said microresonant element.

3. A current sensor in accordance with claim 2 wherein said microresonant element comprises a micro-cantilever element which resonates in response to external magnetic fields.

4. A current sensor in accordance with claim 2 wherein said microresonant element comprises a micro-bridge element which resonates in response to external magnetic fields.

5. A current sensor in accordance with claim 2 wherein said microresonant element comprises first and second portions, said first portion being more compliant to an alternating magnetic field than said second portion.

6. A current sensor in accordance with claim 2 wherein said microresonant element exhibits an oscillation frequency $f_0$ in absence of current in said biasing coil and a modified oscillation frequency f in the presence of current in said biasing coil and said current-carrying conductor, enabling determination of current magnitude in the current-carrying conductor as a multiple of the product of a frequency ratio of $f/f_0$ and the current in said biasing coil.

7. A current sensor in accordance with claim 1 wherein said sensing element comprises a pressure membrane and a plate separated by at least one spacer, said biasing coil being affixed to said membrane, and an optic fiber secured at a first end to said plate.

8. A current sensor in accordance with claim 7 wherein each of said membrane and said plate includes a substantially reflective surface, each of said reflective surfaces facing the other of said reflective surfaces.

9. A current sensor in accordance with claim 7 wherein said membrane includes first and second portions, said first portion being more compliant to an alternating magnetic field than said second portion.

10. A current sensor in accordance with claim 9 further comprising a light source and optical coupler, said light source and optical coupler each being secured to a second end of said optic fiber, said light source being configured to transmit light signals to said membrane, said optical coupler being configured to separate light signals returning from said membrane, whereby the returning signals return at a frequency $f_0$ in the absence of current in said biasing coil, and return at a frequency f in the presence of current in said biasing coil and said current-carrying conductor, enabling determination of current in the current-carrying conductor as a multiple of the product of a frequency ratio $f/f_0$ and the current in said biasing coil.

11. A method for measuring current in a current-carrying conductor using a current sensor including a magnetic core having first and second ends with a gap therebetween and shaped to form a conductor opening, said current-carrying conductor extending through said conductor opening, a current sensing element, and a bias alternating current source, the current sensing element including a biasing coil affixed thereto, the current sensing element being positioned proximate the gap so that the current sensing element moves in response to a magnetic field produced by the biasing coil, the biasing coil being electrically coupled to the bias alternating current source, said method comprising the steps of:

determining current sensing element displacement in the presence of current in the biasing coil; and determining current magnitude in the current-carrying conductor from the determined current sensing element displacement.

12. A method in accordance with claim 11 wherein the current sensing element further includes a microresonant element, the biasing coil being affixed to the microresonant element, said microresonant element being positioned proximate the gap such that the microresonant element resonates in response to a magnetic field produced by the current-carrying conductor, and wherein the steps of determining the current sensing element displacement comprises the steps of:

determining a standard oscillating frequency $f_0$ of the microresonant element; and determining a modified oscillating frequency f of the microresonant element when current is present in the biasing coil.

13. A method in accordance with claim 12 wherein the step of determining current magnitude in the current-carrying conductor comprises the step of generating a frequency ratio $f_0$.

14. A method in accordance with claim 12 wherein the step of determining a modified oscillating frequency f comprises the step of establishing a current in the biasing coil so that the magnetic field of the biasing coil interacts with the magnetic field of the current-carrying conductor.

15. A method in accordance with claim 11 wherein the current sensing element further includes a microresonant element, the biasing coil being affixed to the microresonant element, and the microresonant element being positioned proximate the gap such that the microresonant element resonates in response to a magnetic field produced by the current-carrying conductor, and wherein the step of determining the current sensing element displacement comprises the steps of:

determining a standard oscillating amplitude $A_0$ of the microresonant element; and determining a modified oscillating amplitude A of the microresonant element when current is present in the biasing coil.

16. A method in accordance with claim 11 wherein the current sensing element includes a pressure membrane and a plate separated by at least one spacer, the biasing coil being affixed to said membrane, an optic fiber secured at a first end to said plate and secured at a second end to a light source and optical coupler, the light source transmitting light signals through the optic fiber to the pressure membrane, the optical coupler separating light signals returning from the pressure membrane, and wherein the step of determining the current sensing element displacement comprises the steps of:

determining a standard frequency $f_0$ of light signals returning from the pressure membrane; and determining a modified frequency f of light signals returning from the pressure membrane.

17. A method in accordance with claim 16 wherein the step of determining current magnitude in the current-carrying conductor comprises the step of generating a normalized frequency ratio of $f/f_0$.

18. A method in accordance with claim 11 wherein the current sensing element includes a pressure membrane and a plate separated by at least one spacer, the biasing coil being affixed to said membrane, an optic fiber secured at a first end to said plate and secured at a second end to a light source and optical coupler, the light source transmitting light signals through the optic fiber to the pressure membrane, the optical coupler separating light signals returning from the pressure membrane, and wherein the step of determining the current sensing element displacement comprises the steps of:

determining a standard oscillating amplitude $A_0$ of the pressure membrane; and determining a modified oscillating amplitude A of the pressure membrane when current is present in the biasing coil.

* * * * *